United States Patent
Lozhkin

(10) Patent No.: US 9,252,714 B2
(45) Date of Patent: Feb. 2, 2016

(54) TRANSMISSION SIGNAL POWER CONTROL DEVICE AND COMMUNICATION APPARATUS

(71) Applicant: FUJITSU LIMITED, Kawasaki-shi, Kanagawa (JP)

(72) Inventor: Alexander Nikolaevich Lozhkin, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 162 days.

(21) Appl. No.: 14/067,115

(22) Filed: Oct. 30, 2013

(65) Prior Publication Data

US 2014/0187183 A1    Jul. 3, 2014

(30) Foreign Application Priority Data

Dec. 28, 2012  (JP) ................................. 2012-288524

(51) Int. Cl.
  *H04B 7/00*        (2006.01)
  *H03F 1/02*        (2006.01)
  *H03F 3/24*        (2006.01)
  *H04W 52/52*       (2009.01)

(52) U.S. Cl.
  CPC .............. *H03F 1/0277* (2013.01); *H03F 3/245* (2013.01); *H04W 52/52* (2013.01); *Y02B 60/50* (2013.01)

(58) Field of Classification Search
  CPC ............ H03F 1/3247; H03F 2200/451; H03F 2200/78; H03F 1/0272; H03G 3/004; H04W 52/52; H04B 17/13; F02B 2275/22; F02B 23/08

USPC ................ 455/522, 114.3, 115.1, 115.5, 126, 455/127.2
  See application file for complete search history.

(56) References Cited

U.S. PATENT DOCUMENTS

| | | | |
|---|---|---|---|
| 5,748,038 A * | 5/1998 | Boscovic et al. ................. 330/2 |
| 6,496,062 B1 * | 12/2002 | Nitz et al. ........................ 330/52 |
| 7,679,433 B1 | 3/2010 | Li | |
| 8,032,097 B2 * | 10/2011 | Drogi et al. ................. 455/127.5 |
| 8,106,826 B2 * | 1/2012 | Fox ............................... 342/373 |
| 2007/0232246 A1 | 10/2007 | Lozhkin et al. | |
| 2008/0130767 A1 | 6/2008 | Lozhkin | |
| 2010/0310007 A1 | 12/2010 | Lozhkin | |

FOREIGN PATENT DOCUMENTS

| | | |
|---|---|---|
| JP | 2007-274075 A | 10/2007 |
| JP | 2008-005067 A | 1/2008 |
| JP | 2008-141415 A | 6/2008 |
| JP | 2011-510525 A | 3/2011 |

* cited by examiner

*Primary Examiner* — Sonny Trinh
(74) *Attorney, Agent, or Firm* — Arent Fox LLP

(57) ABSTRACT

A transmission signal power control device includes: at least one low-power attenuator configured to attenuate amplitude of a transmission signal when an absolute value of the amplitude of the transmission signal is smaller than or equal to a clipping threshold; a power amplifier configured to amplify the transmission signal output from the at least one low-power attenuator; and a control unit configured to stop operation of the power amplifier when the absolute value of the amplitude of the transmission signal is smaller than or equal to a value and operate the power amplifier when the absolute value of the amplitude of the transmission signal is larger than the value.

11 Claims, 8 Drawing Sheets

TRANSMISSION SIGNAL POWER CONTROL DEVICE AND COMMUNICATION APPARATUS

CROSS-REFERENCE TO RELATED APPLICATION

This application is based upon and claims the benefit of priority of the prior Japanese Patent Application No. 2012-288524, filed on Dec. 28, 2012, the entire contents of which are incorporated herein by reference.

FIELD

The embodiments discussed herein are related to a transmission signal power control device and a communication apparatus.

BACKGROUND

In a wireless communication system, it is desired to use a communication apparatus whose size and power consumption are small.

Examples of the related art are disclosed in Japanese Laid-open Patent Publication No. 2007-274075 and U.S. Pat. No. 7,679,433.

SUMMARY

According to one aspect of the embodiments, a transmission signal power control device includes: at least one low-power attenuator configured to attenuate amplitude of a transmission signal when an absolute value of the amplitude of the transmission signal is smaller than or equal to a clipping threshold; a power amplifier configured to amplify the transmission signal output from the at least one low-power attenuator; and a control unit configured to stop operation of the power amplifier when the absolute value of the amplitude of the transmission signal is smaller than or equal to a value and operate the power amplifier when the absolute value of the amplitude of the transmission signal is larger than the value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
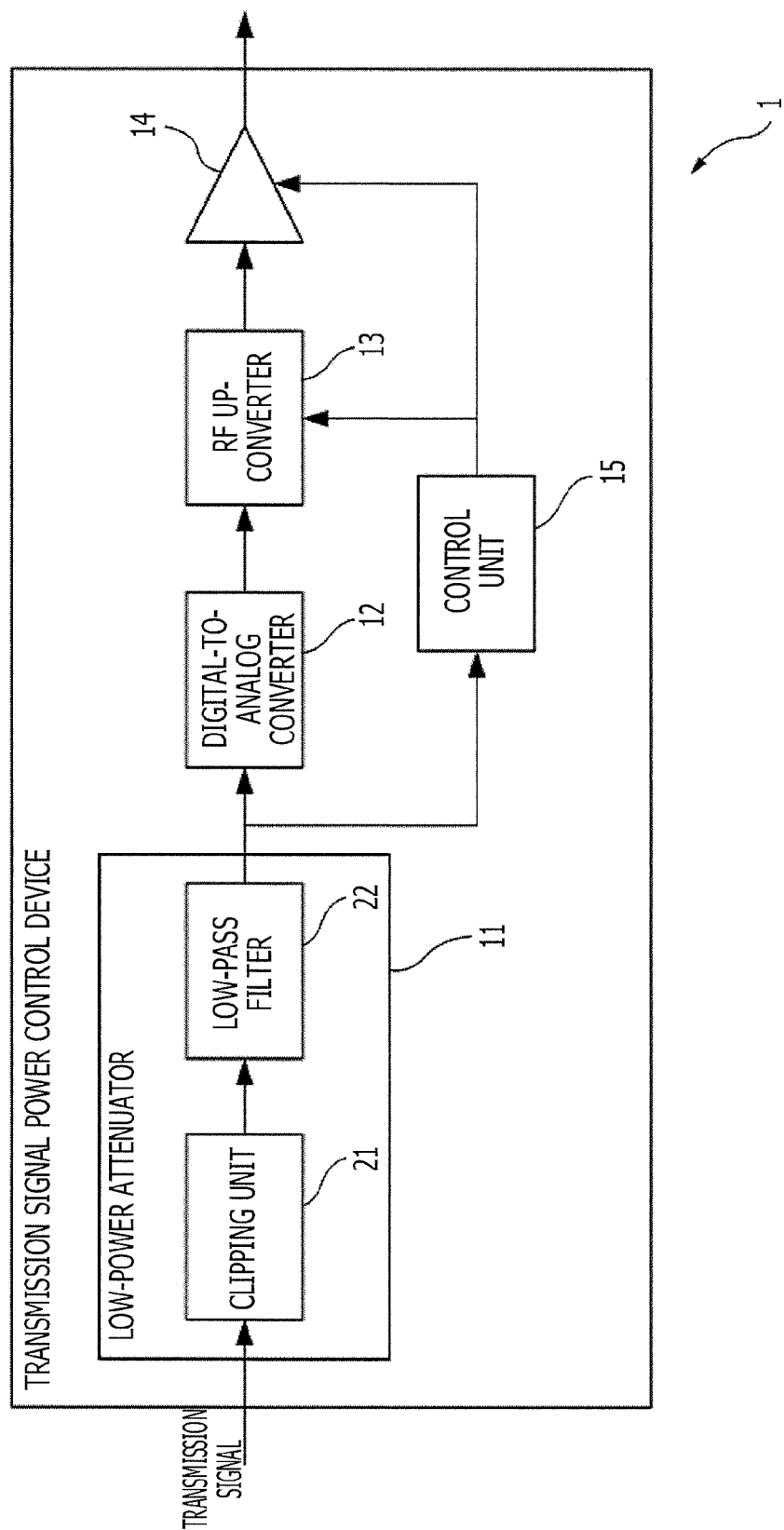
FIG. 1 illustrates an example of a transmission signal power control device.

Because the power consumption of a power amplifier for amplifying the power of a transmission signal included in a communication apparatus is large, the energy efficiency of the power amplifier may be improved. Therefore, the power amplifier is used in a region in which the energy efficiency is high relative to input power of a transmission signal. As a power amplifier whose energy efficiency is high, for example, a Doherty amplifier, a linear amplification using nonlinear components (LINC) amplifier that uses an outphasing technique, an envelope elimination and restoration (EER) amplifier, or the like may be used. The energy efficiency of such a power amplifier strongly depends on the dynamic range of input signal power, and as the dynamic range becomes wider, the energy efficiency decreases. However, the dynamic range of a wireless signal is large in a wireless communication standard such as wideband code division multiple access (W-CDMA), long-term evolution (LTE), or Worldwide Interoperability for Microwave Access (WiMAX; trademark). Therefore, the peak-to-average power ratio (PAPR) of the wireless signal might be high, and the energy efficiency of the power amplifier might decrease.

The decrease in the energy efficiency of the power amplifier may be reduced by attenuating the peak power of the transmission signal and decreasing the PAPR.

In the transmission signal power control device, when the absolute value of the amplitude of a transmission signal is smaller than or equal to a clipping threshold, a transmission signal power control device clips the transmission signal such that the amplitude becomes zero, and when the amplitude is zero, the power amplifier stops. Therefore, the decrease in the energy efficiency of the power amplifier might be reduced. Because a high-frequency component generated by clipping the transmission signal is attenuated by a low-pass filter in the transmission signal power control device, distortion of the transmission signal might be reduced.

The transmission signal power control device may be mounted on various communication apparatuses that amplify transmission signals using power amplifiers and that output the amplified transmission signals. For example, the transmission signal power control device may be mounted on a base station apparatus or a mobile station apparatus in a mobile communication system according to a certain communication standard. The certain communication standard may be, for example, LTE or mobile WiMAX.

A transmission signal to be input to the transmission signal power control device may be a digital signal multiplexed using a certain multiplexing method and modulated using a certain modulation method. For example, the transmission signal may be a signal obtained when a signal obtained by performing an inverse fast Fourier transform on each subcarrier modulated using an orthogonal frequency-division multiplexing method in accordance with a signal value have been subjected to parallel-to-signal conversion. For example, a low-power attenuator 11 may receive the transmission signal from a baseband processing unit.

FIG. 1 illustrates an example of a transmission signal power control device. A transmission signal power control device 1 includes a low-power attenuator 11, a digital-to-analog converter 12, a radio frequency up-converter 13, a power amplifier 14, and a control unit 15. These components included in the transmission signal power control device 1 may be, for example, mounted on the transmission signal power control device 1 as separate circuits.

When the absolute value of the amplitude of a transmission signal is equal to or smaller than the certain clipping threshold, the low-power attenuator 11 decreases the amplitude to zero. For this purpose, the low-power attenuator 11 includes a clipping unit 21 and a low-pass filter 22. Processes of the clipping unit 21 and the low-pass filter 22 may be performed, for example, by executing a program on a digital signal processor.

The clipping unit 21 compares the absolute value of the amplitude of a transmission signal with a certain clipping threshold $\alpha$. When the absolute value of the amplitude of the transmission signal is smaller than or equal to the clipping threshold $\alpha$, the clipping unit 21 attenuates the amplitude of the transmission signal or, preferably, decreases the amplitude to zero. The clipping process performed by the clipping unit 21 is expressed by the following expression.

$$y(t) = \begin{cases} r(t) & |r(t)| > \alpha \\ 0 & |r(t)| \le \alpha \end{cases} \quad (1)$$

r(t) denotes the amplitude of the transmission signal at a time t. y(t) denotes the amplitude of the transmission signal output from the clipping unit 21 at the time t.

Figure 2:
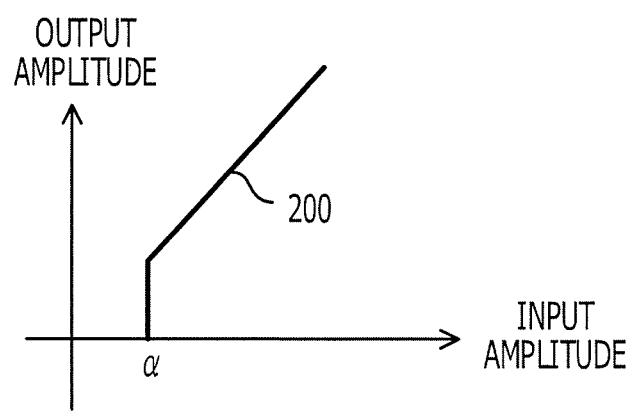
FIG. 2 illustrates an example of a relationship between input amplitude and output amplitude.

FIG. 2 illustrates an example of a relationship between input amplitude and output amplitude. In FIG. 2, a relationship between the amplitude of a transmission signal input to the clipping unit 21 and the amplitude of the transmission signal output from the clipping unit 21 is illustrated. In FIG. 2, the horizontal axis represents the amplitude of the transmission signal input to the clipping unit 21, and the vertical axis represents the amplitude of the transmission signal output from the clipping unit 21. A line 200 indicates the input/output characteristics of the clipping unit 21. As illustrated in FIG. 2, when the absolute value of the amplitude of the input transmission signal is smaller than or equal to the clipping threshold $\alpha$, the amplitude of the output transmission signal becomes substantially zero. When the absolute value of the amplitude of the input transmission signal is larger than the clipping threshold $\alpha$, the amplitude of the output transmission signal is substantially equal to the amplitude of the input transmission signal.

Figure 3:
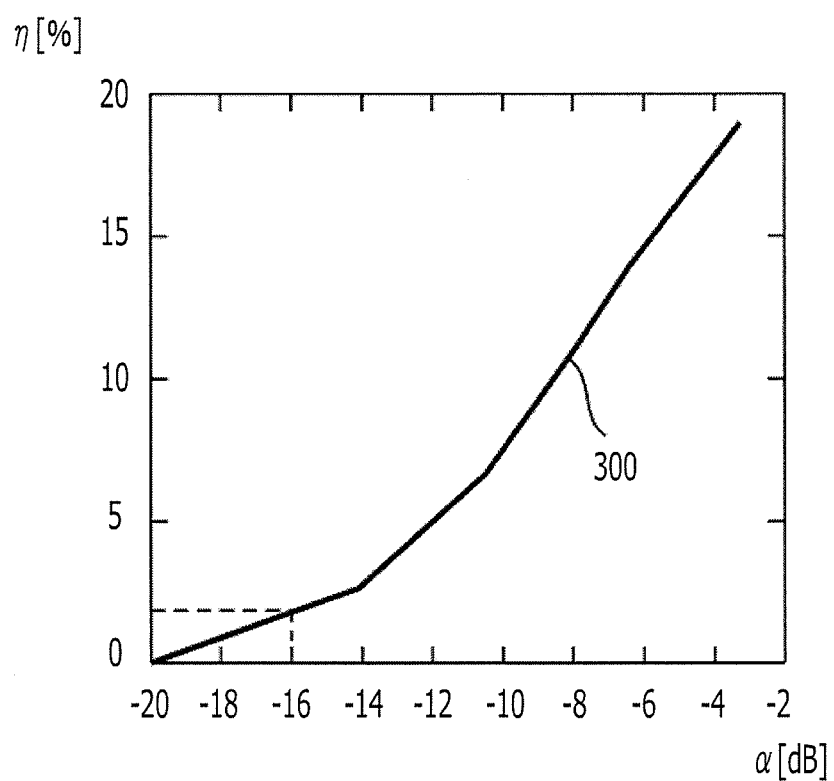
FIG. 3 illustrates an example of a relationship between a clipping threshold and an improvement rate of energy efficiency.

FIG. 3 illustrates an example of a relationship between a clipping threshold and an improvement rate of energy efficiency. FIG. 3 is a diagram illustrating an example of the relationship between the clipping threshold $\alpha$ and the improvement rate of the energy efficiency of the power amplifier. In FIG. 3, the horizontal axis represents the clipping threshold $\alpha$ (unit: dB), and the vertical axis represents an improvement rate $\eta$ (unit: %) of the energy efficiency relative to the energy efficiency of the power amplifier 14 at a time when the transmission signal is not clipped. A line 300 indicates the relationship between the clipping threshold $\alpha$ and the improvement rate of the energy efficiency. As indicated by the line 300, the energy efficiency $\eta$ increases as the clipping threshold $\alpha$ becomes larger.

Because the waveform of the transmission signal is more distorted as the clipping threshold $\alpha$ becomes larger, EVM might also increase. Therefore, the clipping threshold $\alpha$ may be set to a value corresponding to an allowable maximum value of the EVM of the communication apparatus on which the transmission signal power control device 1 is mounted.

Figure 4:
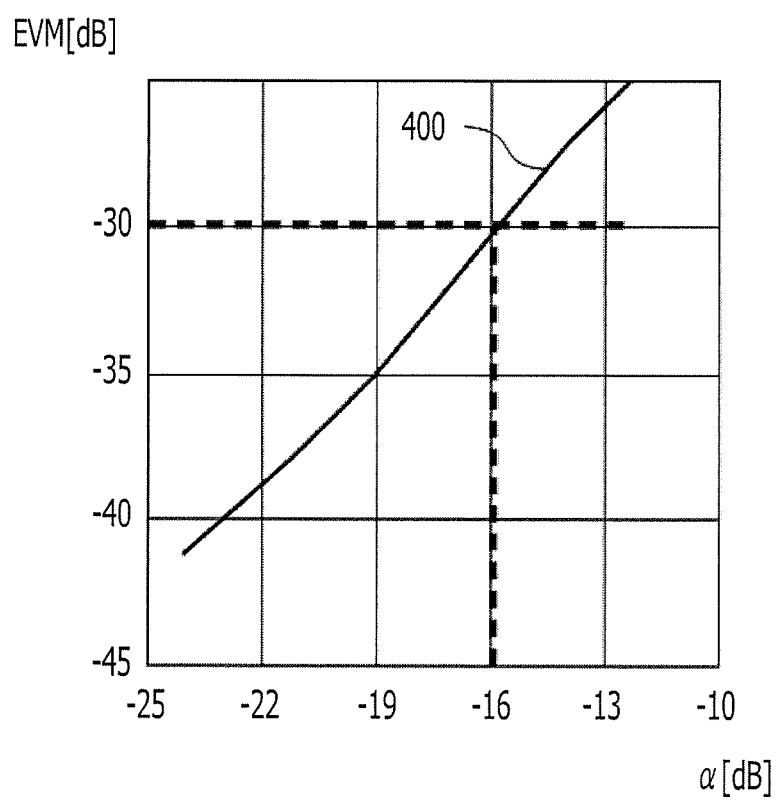
FIG. 4 illustrates an example of a relationship between a clipping threshold and error vector magnitude (EVM)

FIG. 4 illustrates an example of a relationship between a clipping threshold and an EVM. In FIG. 4, the horizontal axis represents the clipping threshold (unit: dB), and the vertical axis represents the EVM (unit: dB). A line 400 indicates the relationship between the clipping threshold $\alpha$ and the EVM. For example, according to the line 400, when the allowable maximum value of the EVM is −30 dB, the corresponding clipping threshold $\alpha$ is −16 dB. According to the line 300 illustrated in FIG. 3, when the clipping threshold $\alpha$ is −16 dB, the improvement rate $\eta$ of the energy efficiency of the power amplifier 14 is more than 2%.

The clipping unit 21 outputs the transmission signal to the low-pass filter 22.

Since the transmission signal is distorted when the transmission signal is clipped, an out-of-band frequency component having a frequency higher than a highest frequency of the original transmission signal is generated. When the out-of-band frequency component increases, signal power might leak between adjacent channels. The low-pass filter 22 attenuates a frequency component having a frequency higher than the highest frequency of the original transmission signal that has been received from the clipping unit 21 and whose low-power component has been clipped, that is, for example, the out-of-band frequency component generated by the clipping. Therefore, the distortion of the transmission signal caused by the clipping may be corrected. The low-pass filter 22 outputs the transmission signal to the digital-to-analog converter 12 and the control unit 15.

The digital-to-analog converter 12 converts the transmission signal that has been received from the low-power attenuator 11 and whose low-power component has been clipped into an analog signal in order to input the transmission signal to the power amplifier 14. The digital-to-analog converter 12 outputs the converted transmission signal to the radio frequency up-converter 13.

The radio frequency up-converter 13 (hereinafter referred to as an RF up-converter) includes an oscillator that outputs a local oscillation signal, which is a periodic signal having a local oscillation frequency, and a multiplier. The RF up-converter 13 superimposes the converted transmission signal upon a carrier wave having a radio frequency by multiplying the converted transmission signal by the local oscillation signal. The RF up-converter 13 outputs the transmission signal superimposed upon the carrier wave to the power amplifier 14.

The power amplifier 14 amplifies the transmission signal superimposed upon the carrier wave. The power amplifier 14 may be, for example, a power amplifier capable of amplifying a signal having a radio frequency, for example, a LINC amplifier. The power amplifier 14 amplifies the transmission signal while the power amplifier 14 is operating, and does not amplify the transmission signal while the power amplifier 14 is stopped. A signal output from the power amplifier 14 is, for example, transmitted to an antenna through a duplexer and radiated from the antenna as a wireless signal.

The control unit 15 includes, for example, a comparator or a digital signal processor, and compares the amplitude of the transmission signal received from the low-power attenuator 11 with a certain threshold. The certain threshold is, for example, set to a value smaller than or equal to the clipping threshold used by the clipping unit 21, namely, for example, zero. If the absolute value of the amplitude of the transmission signal is larger than the certain threshold, the control unit 15 operates the power amplifier 14. On the other hand, if the absolute value of the amplitude of the transmission signal is smaller than or equal to the certain threshold, the control unit 15 stops the power amplifier 14. In order to stop the power amplifier 14, for example, the control unit 15 outputs a control signal for stopping supplying power to the power amplifier 14 to a drive circuit that supplies driving power to the power amplifier 14. The control unit 15 may stop the power amplifier 14 by setting the power amplifier 14 to a cutoff mode through bias control. In any case, drain current flowing through the power amplifier 14 becomes substantially zero while the power amplifier 14 is stopped, and therefore a loss of energy in the power amplifier 14 might be reduced.

When the amplitude of the original transmission signal is so small that the amplitude is clipped, the transmission signal power control device keeps the power amplifier from operating. Therefore, the energy efficiency of the power amplifier improves.

For example, the transmission signal power control device may include a plurality of low-power attenuators coupled in series with one another.

Figure 5:
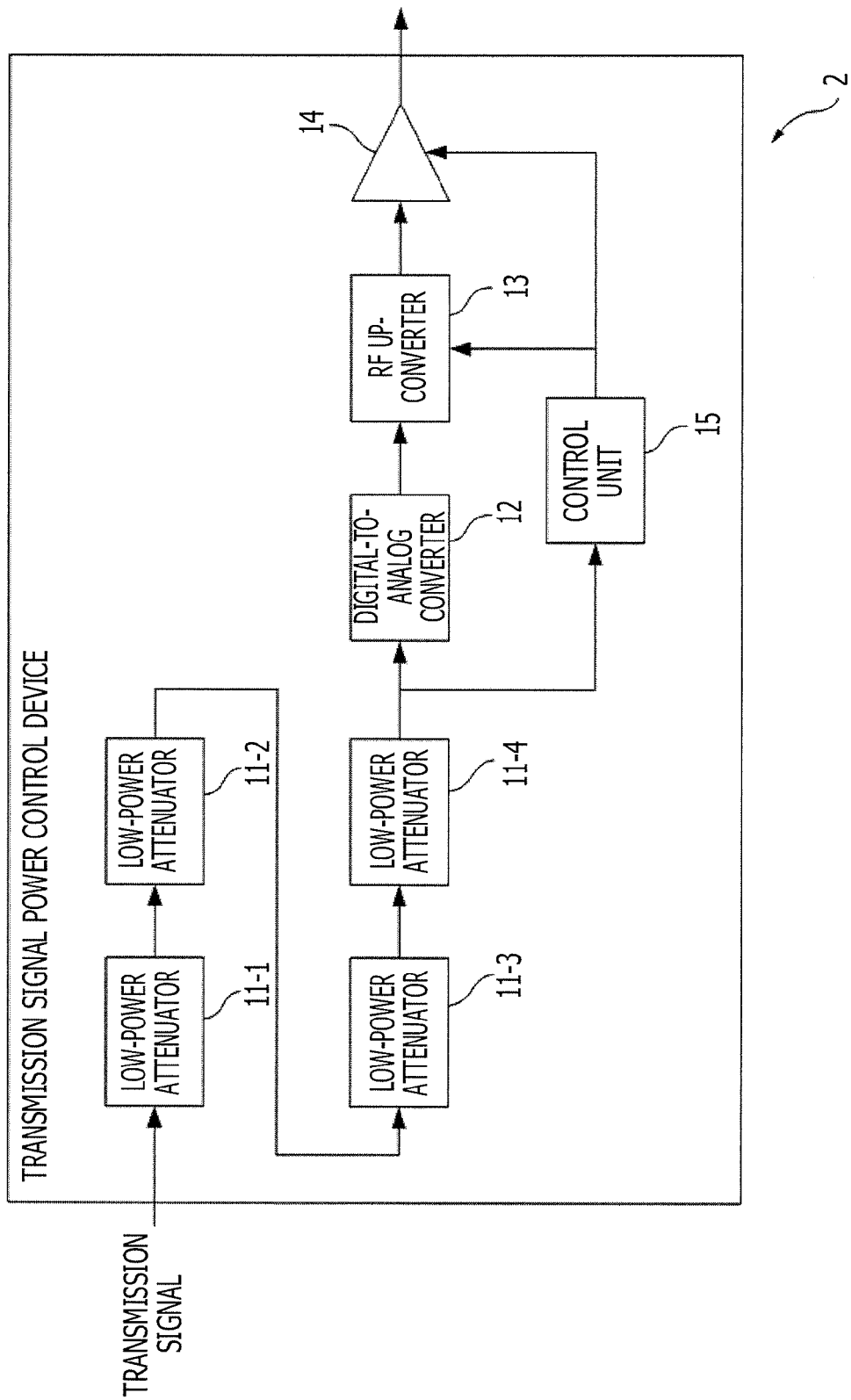
FIG. 5 illustrates an example of a transmission signal power control device.

FIG. 5 illustrates an example of a transmission signal power control device. A transmission signal power control device 2 illustrated in FIG. 5 includes four low-power attenuators 11-1 to 11-4 connected in series with one another, a digital-to-analog converter 12, an RF up-converter 13, a power amplifier 14, and a control unit 15. In FIG. 5, components that are substantially the same as or similar to the components of the transmission signal power control device 1 illustrated in FIG. 1 are given the same reference numerals, and description thereof might be omitted or reduced. Unlike the transmission signal power control device 1 illustrated in FIG. 1, the transmission signal power control device 2 illustrated in FIG. 5 includes the plurality of low-power attenuators coupled in series with one another.

As with the low-power attenuator 11 of the transmission signal power control device 1 illustrated in FIG. 1, the low-power attenuators 11-1 to 11-4 each include a clipping unit and a low-pass filter that follows the clipping unit. When the absolute value of the amplitude of an input transmission signal is smaller than or equal to a clipping threshold, the clipping unit of the low-power attenuator 11-1 decreases the amplitude to substantially zero. In the transmission signal output from the clipping unit, a frequency component having a frequency higher than a highest frequency of the power of the original transmission signal is attenuated by the low-pass filter.

The transmission signal output from the low-pass filter of the low-power attenuator 11-1 sequentially passes through the low-power attenuator 11-2, the low-power attenuator 11-3, and the low-power attenuator 11-4, and is then input to the digital-to-analog converter 12 and the control unit 15. The low-power attenuators 11-2 to 11-4 may execute substantially the same processing on the input transmission signal as that executed by the low-power attenuator 11-1. The transmission signal power control device 2 might reduce distortion of the transmission signal by repeating the clipping of low power and the attenuation of the high-frequency component generated by the clipping.

Figure 6:
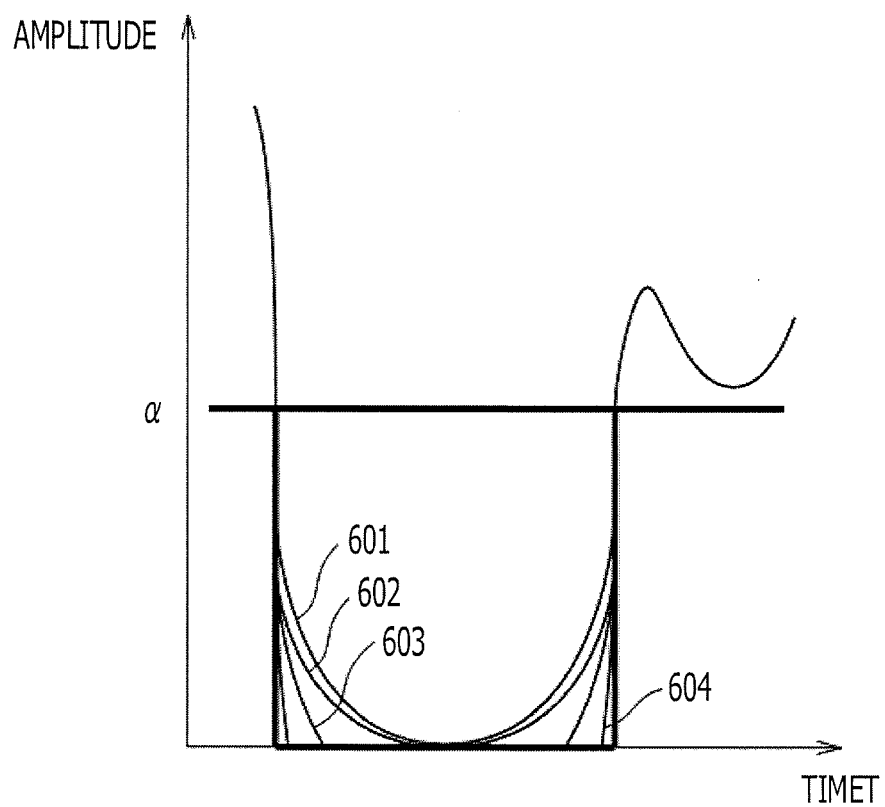
FIG. 6 illustrates an example of relationships between a number of low-power attenuators and distortion of a transmission signal.

FIG. 6 illustrates an example of relationships between a number of low-power attenuators and distortion of a transmission signal. In FIG. 6, the relationship between a number of low-power attenuators coupled in series and distortion of the transmission signal is illustrated. In FIG. 6, the horizontal axis represents time, and the vertical axis represents the amplitude of a transmission signal. A curve 601 indicates the waveform of a transmission signal output from a low-power attenuator at a time when one low-power attenuator is used. Curves 602 to 604 indicate the waveforms of transmission signals output from a low-power attenuator in a final stage when the number of low-power attenuator coupled in series with one another is 2 to 4, respectively. As indicated by the curves 601 to 604, as the number of low-power attenuators through which a transmission signal passes becomes larger, the distortion of the waveform of the transmission signal when the absolute value of the amplitude of the transmission signal is smaller than or equal to the clipping threshold $\alpha$ might be more reduced. For example, as the number of low-power attenuators through which a transmission signal passes becomes larger, a period for which the amplitude remains substantially zero might become longer in a period in which the absolute value of the amplitude of the transmission signal is smaller than or equal to the clipping threshold $\alpha$.

Since the transmission signal power control device includes the plurality of low-power attenuators coupled in series with one another, the distortion of a transmission signal caused by the clipping might be reduced.

Figure 7:
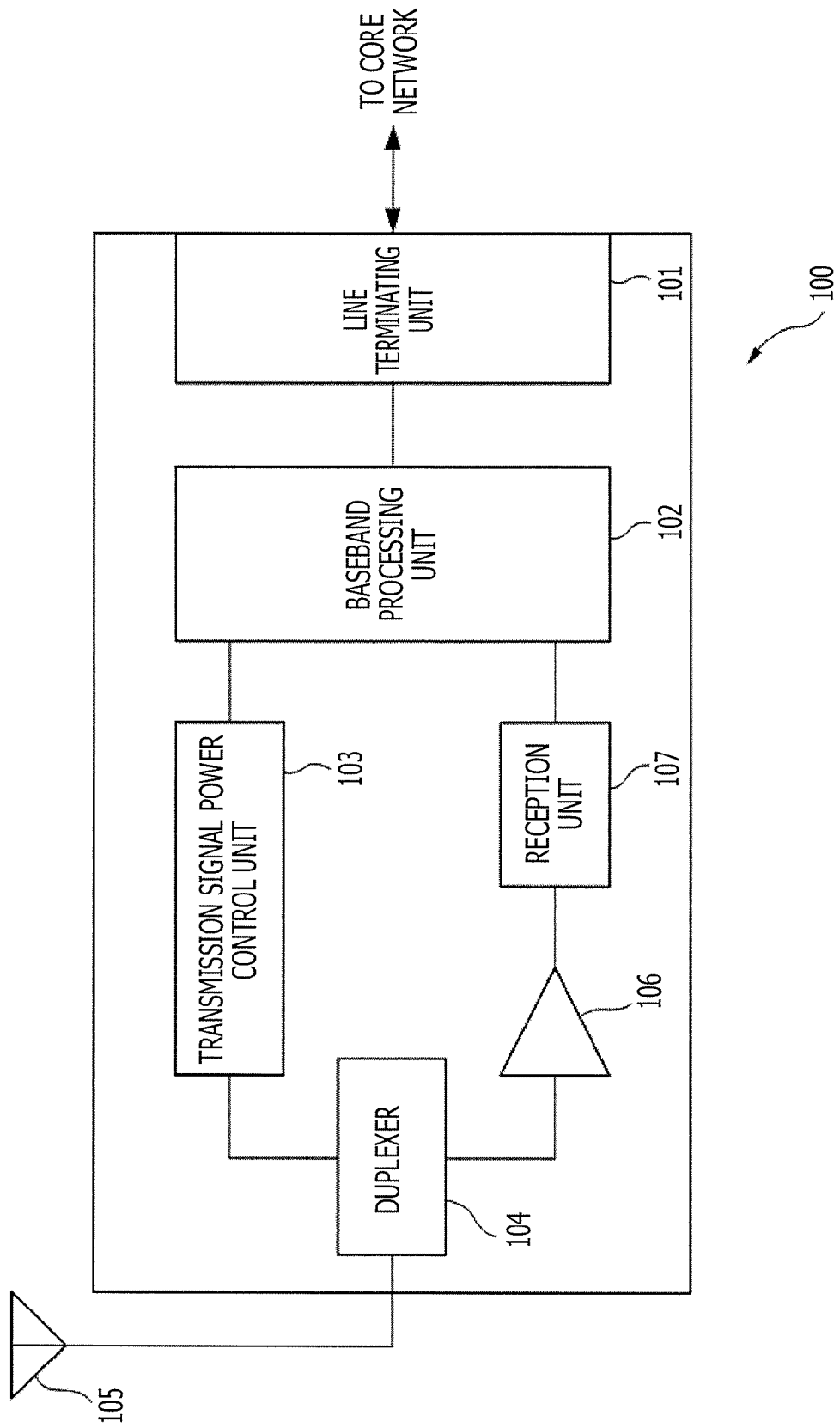
FIG. 7 illustrates an example of a communication apparatus.

FIG. 7 illustrates an example of a communication apparatus. The communication apparatus illustrated in FIG. 7 includes the above-described transmission signal power control device, and may be, for example, a base station apparatus. A base station apparatus 100 includes a line terminating unit 101, a baseband processing unit 102, a transmission signal power control unit 103, a duplexer 104, an antenna 105, a reception amplifier 106, and a reception unit 107. The baseband processing unit 102, the transmission signal power control unit 103, and the reception unit 107 may be separate circuits, or may be included in an integrated circuit.

The line terminating unit 101 includes a communication interface for coupling the base station apparatus 100 to a core network. The line terminating unit 101 receives a downlink signal to be transmitted to a mobile station apparatus from the core network, and outputs the downlink signal to the baseband processing unit 102. The line terminating unit 101 receives, from the baseband processing unit 102, an uplink signal received from a mobile station apparatus, and outputs the uplink signal to the core network.

The baseband processing unit 102 executes, on the downlink signal, a transmission process including an encoding process for correcting an error such as convolutional coding or turbo coding. The baseband processing unit 102 performs an orthogonal modulation process such as orthogonal frequency-division multiple access (OFDMA) on the encoded downlink signal in order to multiplex the downlink signal. The baseband processing unit 102 outputs the downlink signal subjected to the orthogonal modulation process to the transmission signal power control unit 103. The baseband processing unit 102 demodulates the uplink signal having a baseband frequency received from the reception unit 107. The baseband processing unit 102 executes, on the demodulated uplink signal, a reception process including a decoding process for correcting an error. The baseband processing unit 102 outputs the decoded uplink signal to the line terminating unit 101.

The transmission signal power control unit 103 may correspond to the transmission signal power control device. When the absolute value of the amplitude of the downlink signal is smaller than or equal to the clipping threshold, the transmission signal power control unit 103 attenuates the amplitude of the downlink signal, and then converts the downlink signal into an analog signal and superimposes the converted downlink signal upon a carrier wave having a radio frequency. When the attenuation of the amplitude of the downlink signal is not performed, the transmission signal power control unit 103 amplifies the downlink signal superimposed upon the carrier wave using a power amplifier, and transmits the downlink signal to the antenna 105 through the duplexer 104. The antenna 105 radiates the downlink signal transmitted from the transmission signal power control unit 103.

The antenna 105 receives an uplink signal transmitted from a base station apparatus, and transmits the uplink signal to the reception amplifier 106 through the duplexer 104. The reception amplifier 106 includes a low-noise amplifier. The reception amplifier 106 amplifies the received uplink signal, and outputs the amplified uplink signal to the reception unit 107.

The reception unit 107 converts the frequency of the uplink signal from a radio frequency into a baseband frequency by superimposing a periodic signal having a local oscillation frequency upon the uplink signal. The reception unit 107 performs analog-to-signal conversion on the uplink signal having the baseband frequency, and then transmits the converted uplink signal to the baseband processing unit 102.

Figure 8:
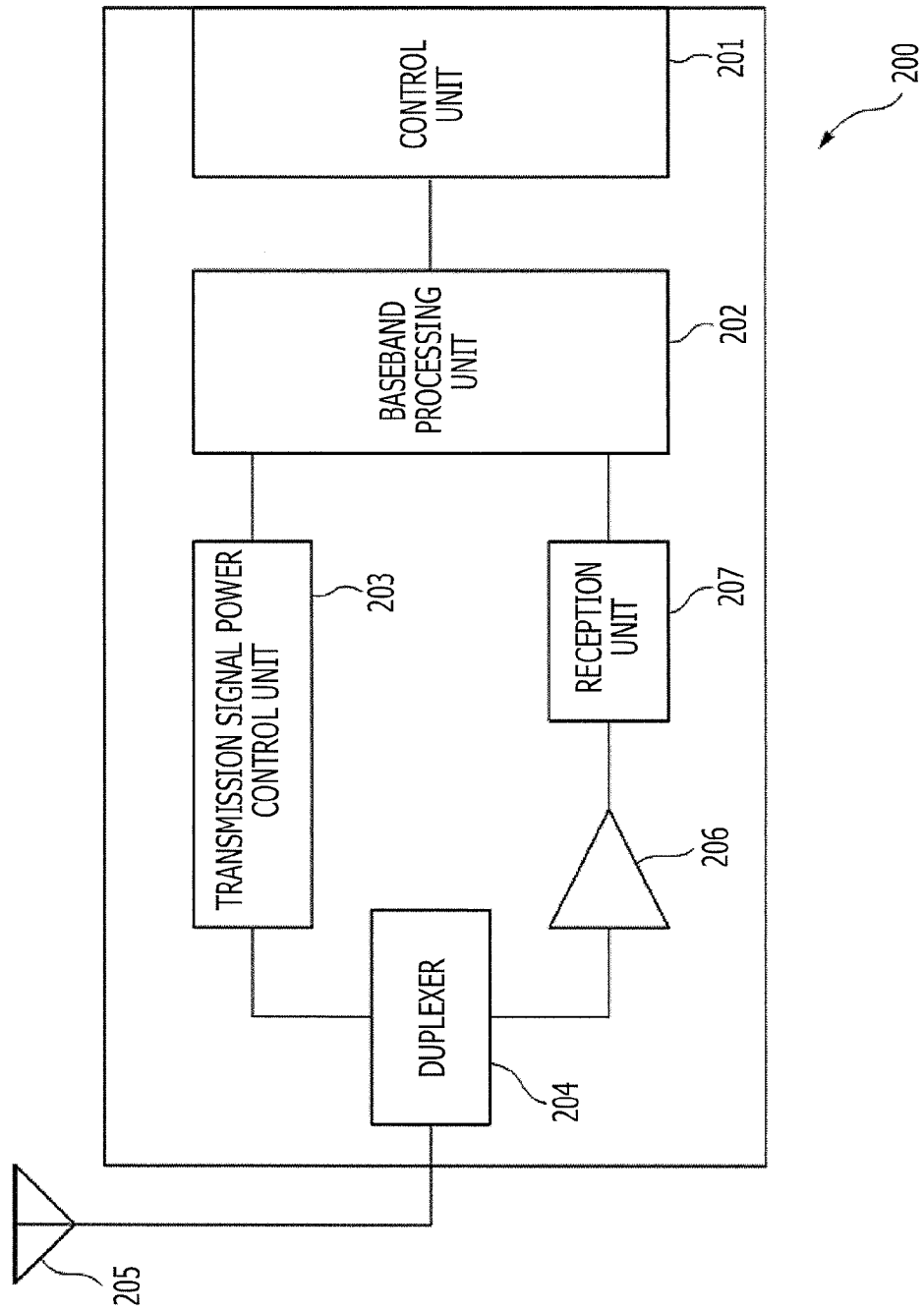
FIG. 8 illustrates an example of a communication apparatus.

FIG. 8 illustrates an example of a communication apparatus. The communication apparatus illustrated in FIG. 8 includes the above-described transmission signal power control device, and may be, for example, a mobile station apparatus. A mobile station apparatus 200 includes a control unit 201, a baseband processing unit 202, a transmission signal power control unit 203, a duplexer 204, an antenna 205, a reception amplifier 206, and a reception unit 207. The control unit 201, the baseband processing unit 202, the transmission signal power control unit 203, and the reception unit 207 may be separate circuits, or may be included in an integrated circuit.

The control unit 201 controls the entirety of the mobile station apparatus 200. The control unit 201 executes various application programs that operate on the mobile station apparatus 200. The control unit 201 includes a processor, a non-volatile memory, and a volatile memory. When an application for enabling communication such as telephone or data communication has been activated by an operation performed by a user through an operation unit such as a keypad included in the mobile station apparatus 200, for example, the control unit 201 executes call control in accordance with the activated application. The control unit 201 executes a process for encoding an information source on data which is requested by the application or an audio signal obtained from a microphone included in the mobile station apparatus 200. The control unit 201 transmits a signal obtained as a result of the process to the baseband processing unit 202 as an uplink signal. Upon receiving a downlink signal from the baseband processing unit 202, the control unit 201 executes a process for decoding an encoded information source and the like in order to obtain an audio signal or data. The control unit 201 transmits the audio signal to a speaker included in the mobile station apparatus 200. The control unit 201 causes a display included in the mobile station apparatus 200 to display the obtained data.

The baseband processing unit 202 executes, on the uplink signal, a transmission process including an encoding process for correcting error such as convolutional coding or turbo coding. The baseband processing unit 202 performs an orthogonal modulation process on the encoded uplink signal in order to multiplex the uplink signal. The baseband processing unit 202 outputs the uplink signal subjected to the orthogonal modulation process to the transmission signal power control unit 203. The baseband processing unit 202 demodulates the downlink signal having a baseband frequency received from the reception unit 207. The baseband processing unit 202 executes, on the demodulated downlink signal, a reception process including a decoding process for correcting an error. The baseband processing unit 202 then outputs the decoded downlink signal to the control unit 201.

The transmission signal power control unit 203 may correspond to the above-described transmission signal power control device. When the absolute value of the amplitude of the uplink signal is smaller than or equal to the clipping threshold, the transmission signal power control unit 203 attenuates the amplitude of the uplink signal, and then converts the uplink signal into an analog signal and superimposes the converted uplink signal upon a carrier wave having a radio frequency. When the attenuation of the amplitude of the uplink signal is not performed, the transmission signal power control unit 203 amplifies the uplink signal superimposed upon the carrier wave using a power amplifier, and transmits the uplink signal to the antenna 205 through the duplexer 204. The antenna 205 radiates the uplink signal transmitted from the transmission signal power control unit 203.

The antenna 205 receives a downlink signal transmitted from a base station apparatus, and transmits the converted downlink signal to the reception amplifier 206 through the duplexer 204. The reception amplifier 206 includes a low-noise amplifier. The reception amplifier 206 amplifies the received downlink signal, and outputs the amplified downlink signal to the reception unit 207.

The reception unit 207 converts the frequency of the downlink signal from a radio frequency into a baseband frequency by superimposing a periodic signal having a local oscillation frequency upon the downlink signal. The reception unit 207 performs analog-to-digital conversion on the downlink signal having the baseband signal, and transmits the downlink signal to the baseband processing unit 202.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A transmission signal power control device, comprising:
   at least one low-power attenuator configured to attenuate an amplitude of a transmission signal when an absolute value of the amplitude of the transmission signal is smaller than or equal to a clipping threshold;
   a power amplifier configured to amplify the transmission signal output from the at least one low-power attenuator; and
   a control unit configured to stop operation of the power amplifier when an output signal from the at least one low-power attenuator is smaller than or equal to a value based on the clipping threshold and operate the power amplifier when the absolute value of the amplitude of the transmission signal is larger than the value.

2. The transmission signal power control device according to claim 1, wherein the value is smaller than or equal to the clipping threshold.

3. The transmission signal power control device according to claim 1, wherein the at least one low-power attenuator includes:
   a clipping unit configured to attenuate the amplitude of the transmission signal when the absolute value of the amplitude of the input transmission signal-is smaller than or equal to the clipping threshold, and
   a low-pass filter configured to attenuate a high-frequency component that is included in the transmission signal output from the clipping unit and that is generated by the clipping unit.

4. The transmission signal power control device according to claim 1, wherein the at least one low-power attenuator includes a plurality of low-power attenuators coupled in series with one another.

5. The transmission signal power control device according to claim 1, wherein the clipping threshold comprises a value corresponding to a maximum value of an error vector amplitude of the transmission signal power control device.

6. A communication apparatus, comprising:
a baseband processing unit configured to generate a transmission signal;
a transmission signal power control unit configured to amplify the transmission signal; and
an antenna configured to radiate the amplified transmission signal, wherein the transmission signal power control unit includes:
at least one low-power attenuator configured to attenuate an amplitude of the transmission signal when an absolute value of the amplitude of the transmission signal is smaller than or equal to a clipping threshold;
a power amplifier configured to amplify the transmission signal; and
a control unit configured to stop operation of the power amplifier when an output signal from the at least one low-power attenuator is smaller than or equal to a value based on the clipping threshold and operate the power amplifier when the absolute value of the amplitude of the transmission signal is larger than the value.

7. The communication apparatus according to claim 6, further comprising:
a line terminating unit configured to receive a downlink signal from a core network, wherein the baseband processing unit generates the transmission signal by encoding the downlink signal.

8. A transmission signal power control device, comprising:
at least one low-power attenuator configured to attenuate an amplitude of a transmission signal when an absolute value of the amplitude of the transmission signal is smaller than or equal to a clipping threshold;
a power amplifier configured to amplify the transmission signal output from the at least one low-power attenuator; and
a control unit configured to stop operation of the power amplifier when the absolute value of the amplitude of the transmission signal is smaller than or equal to a value and operate the power amplifier when the absolute value of the amplitude of the transmission signal is larger than the value, wherein the clipping threshold is a value corresponding to a maximum value of an error vector amplitude of the transmission signal power control device.

9. The transmission signal power control device according to claim 8, wherein the value is smaller than or equal to the clipping threshold.

10. The transmission signal power control device according to claim 8, wherein the at least one low-power attenuator includes:
a clipping unit configured to attenuate the amplitude of the transmission signal when the absolute value of the amplitude of the input transmission signal is smaller than or equal to the clipping threshold, and
a low-pass filter configured to attenuate a high-frequency component that is included in the transmission signal output from the clipping unit and that is generated by the clipping unit.

11. The transmission signal power control device according to claim 8, wherein the at least one low-power attenuator includes a plurality of low-power attenuators coupled in series with one another.

* * * * *